US011004482B1

(12) United States Patent
Lim et al.

(10) Patent No.: US 11,004,482 B1
(45) Date of Patent: May 11, 2021

(54) RETENTION VOLTAGE GENERATOR CIRCUIT

(71) Applicant: Apple Inc., Cupertino, CA (US)

(72) Inventors: Jaemyung Lim, Sunnyvale, CA (US); Jiangyi Li, Santa Clara, CA (US); Mohamed H. Abu-Rahma, Mountain View, CA (US); Shahzad Nazar, Fremont, CA (US); Jaroslav Raszka, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/784,030

(22) Filed: Feb. 6, 2020

(51) Int. Cl.
  *G06F 1/00* (2006.01)
  *G11C 5/14* (2006.01)
(52) U.S. Cl.
  CPC .................................. *G11C 5/147* (2013.01)
(58) Field of Classification Search
  CPC ....................................................... G11C 5/147
  USPC ......................................................... 365/154
  See application file for complete search history.

(56) References Cited

U.S. PATENT DOCUMENTS

| 7,328,413 | B2* | 2/2008 | Kim ........................ G11C 7/02 365/226 |
| 7,400,545 | B2 | 7/2008 | Ramaraju et al. |
| 8,085,579 | B2* | 12/2011 | Inoue .................... G11C 11/413 365/154 |
| 9,123,436 | B2 | 9/2015 | Chiou et al. |
| 9,378,805 | B2 | 6/2016 | Walsh et al. |
| 2006/0206739 | A1* | 9/2006 | Kim ........................ G11C 7/02 713/322 |
| 2009/0244956 | A1* | 10/2009 | Inoue .................... G11C 11/413 365/156 |

\* cited by examiner

*Primary Examiner* — Xiaochun L Chen
(74) *Attorney, Agent, or Firm* — Kowert, Hood, Munyon, Rankin & Goetzel, P.C.

(57) ABSTRACT

Memory circuits used in computer systems may have different operating modes. In a retention mode, a voltage level of an array power supply node coupled to memory cells included in the memory circuit is reduced to a level sufficient to retain data, but not to perform read and write operations to the memory cells. A power converter circuit may be configured to generate the retention voltage level, and adjust the retention voltage level using a leakage current of dummy memory cells included in the memory circuit.

20 Claims, 9 Drawing Sheets

RETENTION VOLTAGE GENERATOR CIRCUIT

BACKGROUND

Technical Field

This disclosure relates to retention mode in computer systems and more particularly to maintaining values of output signals from a circuit block operating in retention mode.

Description of the Related Art

A computer system may include multiple circuit blocks, each designed to perform a particular function. For example, in some computer systems, circuit blocks may include processor circuits, memory circuits, analog/mixed-signal circuits, and the like. Such circuit blocks may be capable of operating in the different operating modes. Switching between such operating modes may be based, at least in part, on power consumption or processing demands of the computer system. For example, to conserve power a computer system may change the operating modes of one or more circuit blocks to operating modes that consume less power.

Switching between the different operating modes of a particular circuit block may involve changing a voltage level of a power supply signal for the particular circuit block. In some cases, in addition to changing the voltage level of the power supply signal, a frequency of a clock signal consumed by the particular circuit block may also be adjusted.

In some operating modes a given circuit may be capable of performing operations at a desired speed. Other operating mode, e.g., retention mode, a voltage level of the power supply for the given circuit block may be reduced so that the given circuit block may not be capable of performing operations, but may still be able to maintain is logical state.

SUMMARY OF THE EMBODIMENTS

Various embodiments of power converter circuit are disclosed. Broadly speaking, a power converter circuit may be configured, in response to an activation of a retention mode, to generate a retention voltage level on an array power supply node, which is coupled to a plurality of memory cells included in a memory array. The power converter circuit may be further configured to adjust the retention voltage level on the array power supply node using a leakage current of a plurality of dummy memory cells included in the memory array. In a different embodiment, the power converter circuit may be further configured to generate a clock signal using the leakage current.

Figure 1:
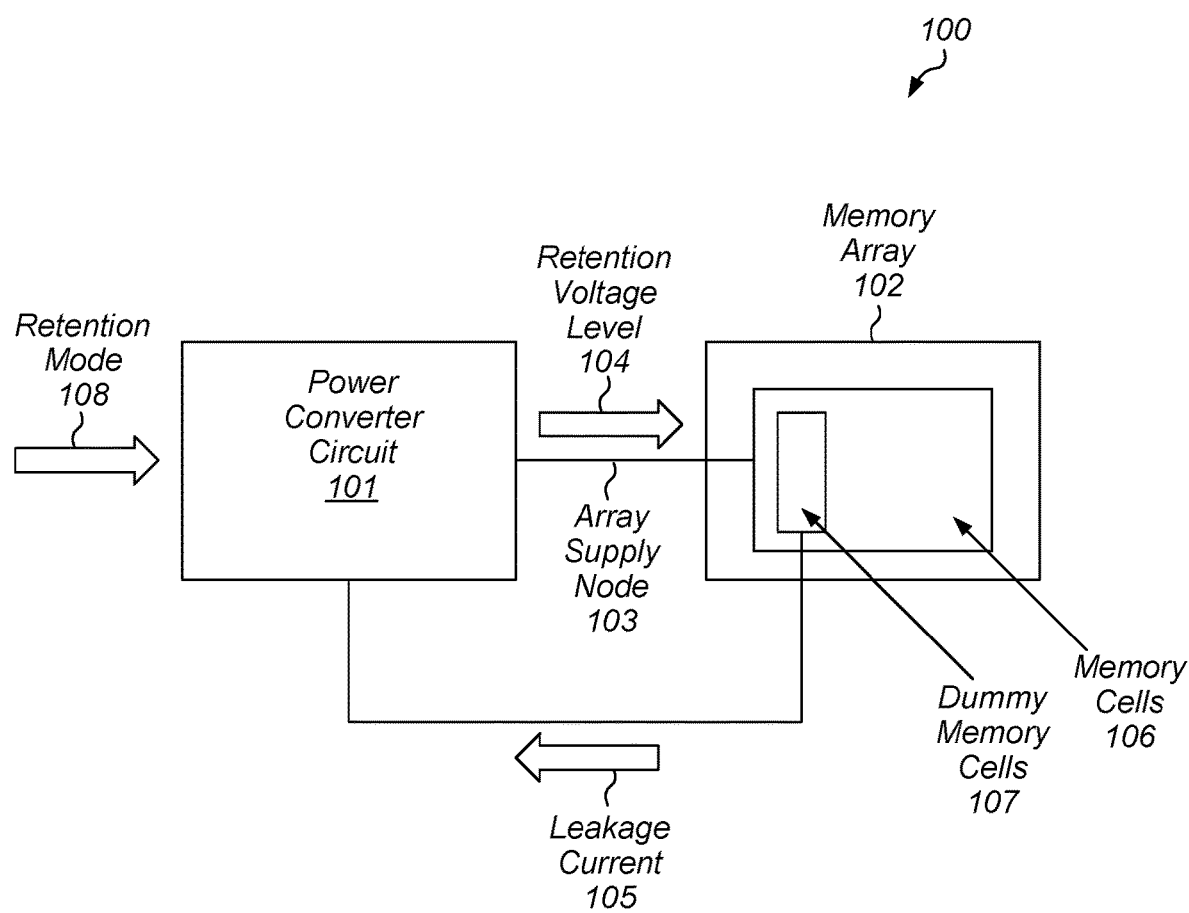
FIG. 1 is a block diagram of an embodiment of a memory circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

A computer system may include multiple memory circuits configured to store data for the computer system. Such data may include program or software instructions, operands on which a processor may perform various operations, and the like. In some cases, the computer system may have different operating modes, some of which may be used to reduce power consumption of the computer system. Changes between the different operating modes may be based on user input, workload of the computer system, or any other suitable metric.

In some of the aforementioned operating modes, a memory circuit may be placed into a retention mode. As used herein, a retention mode for a memory circuit is a mode in which the memory circuit is not capable of performing read and write operations, but will maintain data previous stored in the memory cells of the memory circuit. In retention mode, a voltage level of a local power supply node within the memory dedicated to supplying power to the memory cells (referred to herein as an "array power supply node") may be reduced. Such a reduced level will allow a given memory cell to maintain previously stored data, but not allow read or write operations to the given memory cell.

The reduced voltage level on the array power supply node may be generated using a variety of techniques. For example, a power management unit (or "PMU") may include a voltage regulator circuit dedicated to generate the reduced voltage level, or the memory circuit itself may include one or more diodes, or other suitable circuits, capable of generating the reduced voltage level using a voltage level of an input power supply node. Such methods may, however, provide a fixed voltage level for retention mode, thereby limiting flexibility. Moreover, any circuit used to generate the voltage level for retention mode should consume less power that the power being saved by placing a memory circuit into retention mode, so the efficiency of such power generation circuits is an important design consideration.

Such approaches also fail to compensate for changes in the electrical characteristics of the memory cells in the memory circuit resulting from variation in the manufacturing process used to fabricate the memory circuit. Variation from one memory circuit to another can result in a non-optimal retention voltage level as some memory circuits may require a higher retention voltage to maintain previously stored data, while other memory circuits may be capable of employing lower retention voltage levels. The embodiments illustrated in the drawings and described below may provide techniques for generating a retention voltage level on an array power supply node in a memory circuit, while tracking electrical characteristics of memory cells included in the memory circuit and maintaining efficiency of the generation of the retention voltage level.

A block diagram of a portion of a memory circuit is depicted in FIG. 1. As illustrated, memory circuit 100 includes power converter circuit 101 and memory array 102.

Memory array 102 includes memory cells 106 and dummy memory cells 107. Memory cells 106 are configured to store data during a write operation. Data previously stored in memory cells 106 may be retrieved during a read operation. In various embodiments, memory cells 106 may be static random-access memory (SRAM) cells, dynamic random-access memory (DRAM) cells, register file cells, or any other suitable type of memory cells. Memory cells 106 may, in some embodiments, be coupled to array supply node 103.

Dummy memory cells 107 may include any suitable number of memory cells of the same type used in memory cells 106. For example, if memory cells 106 are SRAM cells, then dummy memory cells 107 will also include SRAM cells. As used herein, a dummy memory cell is a memory cells that is to mimic the electrical characteristics of an actual memory cell. In various embodiments, dummy memory cells are not used to store data. It is noted that although dummy memory cells 107 are depicted as being included in memory array 102, in other embodiments, dummy memory cells 107 may be located within power converted circuit 101, or any other suitable circuit sub-block.

Power converter circuit 101 is configured, in response to activation of retention mode 108, to generate retention voltage level 104 on array supply node 103. In various embodiments, power converter circuit 101 is further configured to adjust retention voltage level 104 on array supply node 103 using leakage current 105 of dummy memory cells 107. By adjusting retention voltage level 104 using leakage current 105, power converter circuit 101 may, in some embodiments, allow for providing a retention voltage level that tracks changes in a semiconductor manufacturing process, operating temperature, and the like.

Although power converter circuit 101 is depicted as being coupled to an array power supply node for a memory circuit, the use of such power converter circuits need not be limited to memory circuit applications. In other embodiments, power converter circuit 101 may be used to generate a retention voltage level for other storage circuits within a computer system, such as, a register file, or other suitable storage circuit.

Figure 2:
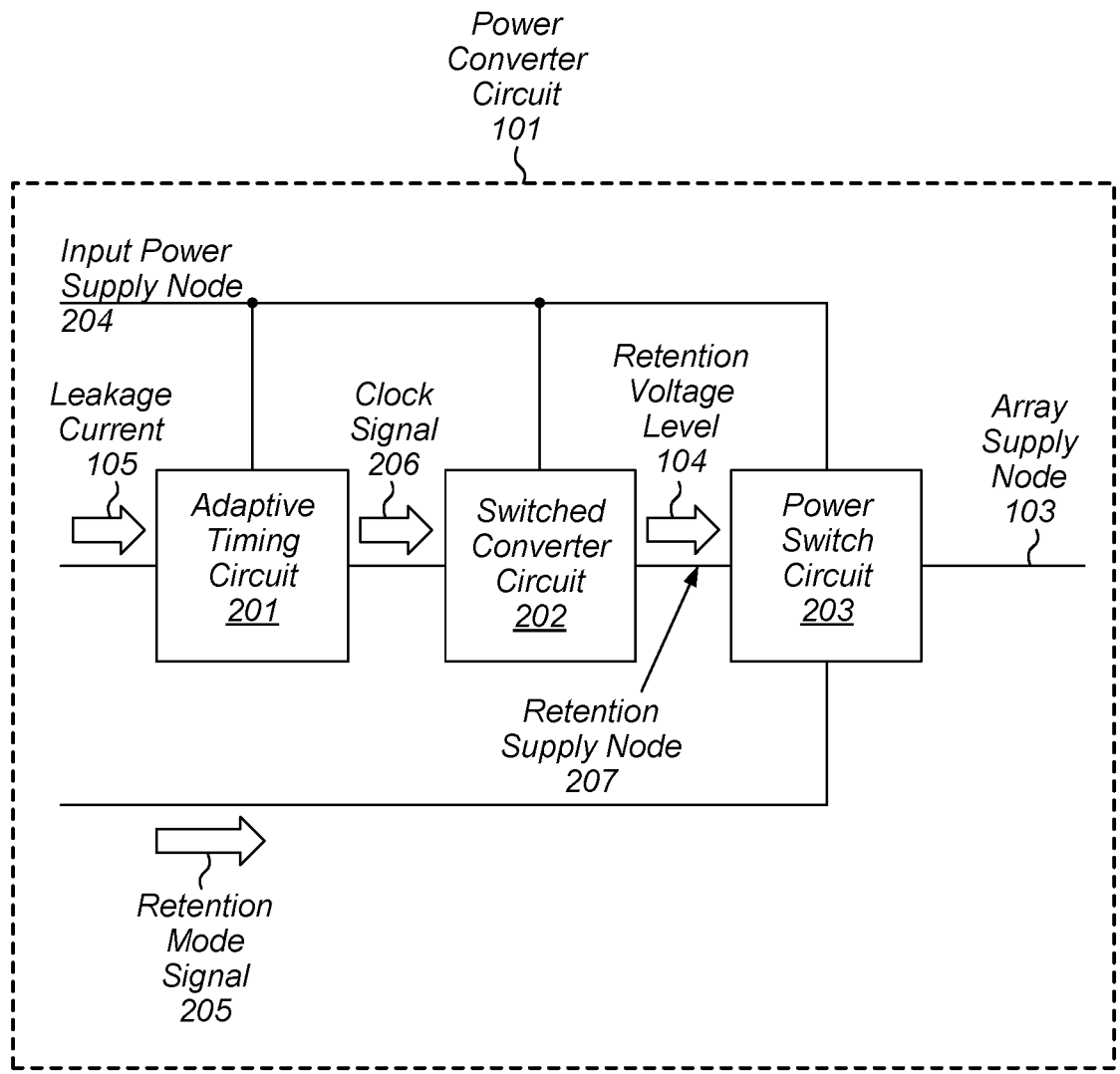
FIG. 2 illustrates a block diagram of an embodiment of power converter circuit.

Power converter circuit 101 may employ a variety of circuits and techniques to generate retention voltage level 104. A block diagram of an embodiment of power converter circuit 101 is depicted in FIG. 2. As illustrated, power converter circuit 101 includes adaptive timing circuit 201, switched converter circuit 202, and power switch circuit 203.

Adaptive timing circuit 201 is configured to generate clock signal 206 using leakage current 105. As used and described herein, a clock signal is a signal that is used as a timing reference to operate other signals. As described below in more detail, adaptive timing circuit may employ a current mirror circuit and a ring oscillator, or any other suitable combination of circuits, to generate clock signal 206.

Switched converter circuit 202 is configured to generate retention voltage level 104 on retention supply node 207 using clock signal 206 and a voltage level of input power supply node 204. As described below in more detail, switched converter circuit 202 selectively charges one or more of a plurality of capacitors to the voltage level of input power supply node 204. Once charged, the one or more of the plurality of capacitors is discharged into retention supply node 207. The timing of the charging and discharging is based, at least in part, on clock signal 206.

Power switch circuit 203 is configured to selectively couple either input power supply node 204 or retention supply node to array supply node 103 using retention mode signal 205. In various embodiments, when retention mode signal 205 is asserted, power switch circuit 203 de-couples input power supply node 204 from array supply node 103 and couples retention supply node to array supply node 103, thereby generating retention voltage level 104 on array supply node 103. As described below in more detail, power switch circuit 203 may include one more switch devices controlled by respective control signals.

As mentioned above, different circuits may be employed in generating a retention voltage level. One circuit that may, in various embodiments, satisfy any efficiency requirements for a computer system, is a switched converter circuit. Switched converter circuits, e.g., switched converter circuit 202, employ multiple capacitors, which are selectively charged using an input power supply node and then discharged into a retention supply node to generate a desired voltage level. By adjusting the timing of the charging and discharging, as well as a number of capacitors used to for given charge and discharge cycle, different voltage levels on the retention supply node may be achieved.

Figure 3:
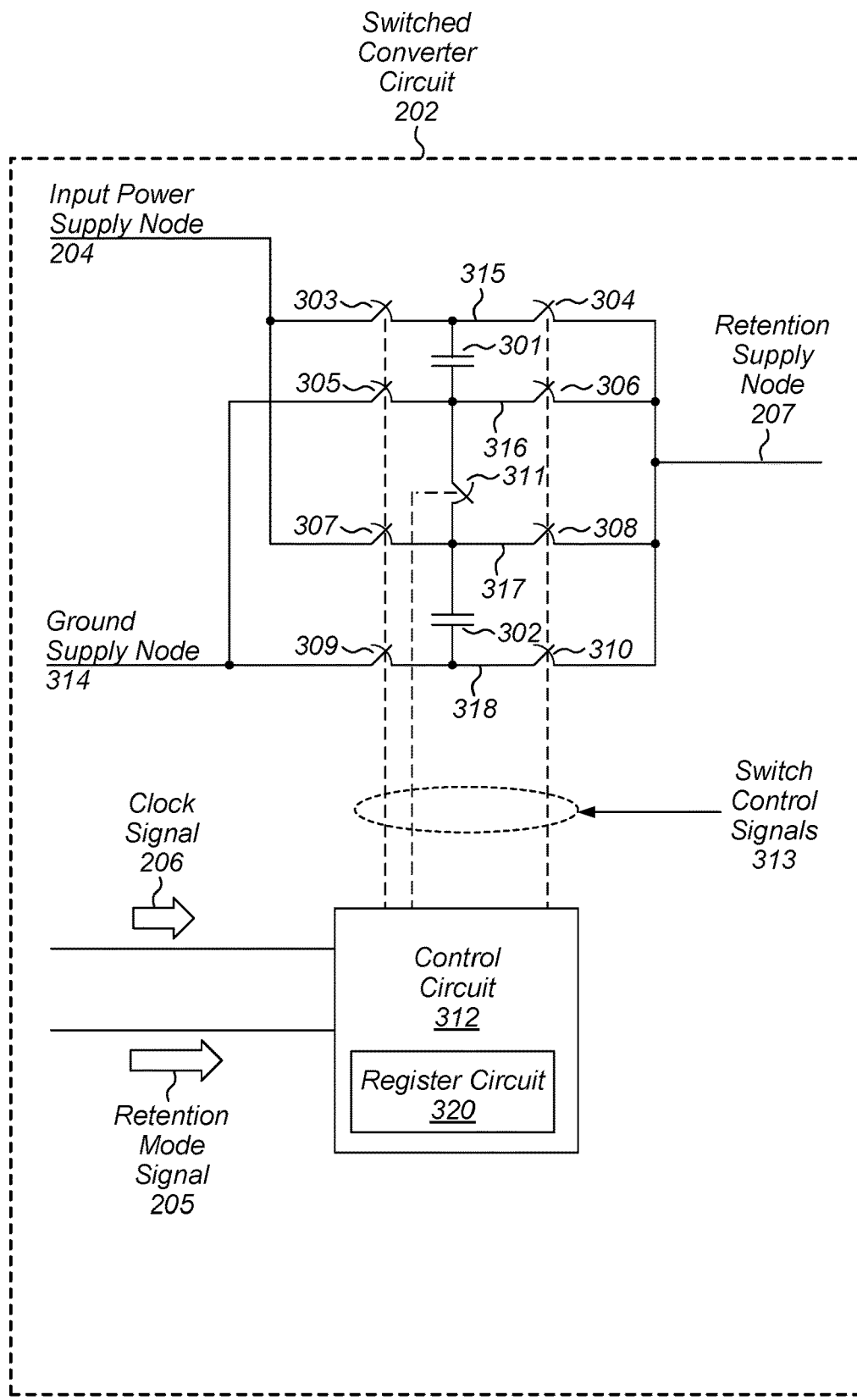
FIG. 3 illustrates a block diagram of an embodiment of a switched converter circuit.

An embodiment of switched converter circuit 202 is depicted in FIG. 3. As illustrated, switched converter circuit 202 includes capacitors 301 and 302, switches 303-311, and control circuit 312. It is noted that although only two capacitors and nine switches are depicted in the embodiment illustrated in FIG. 3, in other embodiments, any suitable number of capacitors and switches may be employed.

Switch 303 is configured to selectively couple input power supply node 204 to node 315 using switch control signals 313, and switch 304 is configured to selectively couple node 315 to retention supply node 207 using switch control signals 313. In a similar fashion, switch 307 is configured to selectively couple input power supply node 204 to node 317 using switch control signals 313, and switch 308 is configured to selectively couple node 317 to retention supply node 207 using switch control signals 313.

Switch 305 is configured to selectively couple ground supply node 314 to node 316 using switch control signals 313, and switch 306 is configured to node 316 to retention supply node 207 using switch control signals 313. In a similar fashion, switch 309 is configured to selectively couple ground supply node 314 to node 318 using switch control signals 313, and switch 310 is configured to selectively couple node 318 to retention supply node 207 using switch control signals 313.

Switch 311 is configured to selectively couple node 316 to node 317 using switch control signals 313. Capacitor 301 is coupled between nodes 315 and 316, and capacitor 302 is coupled between nodes 317 and 318. In various embodiments, capacitors 301 and 302 may be substantially the same value, and may be metal-oxide-metal (MOM) capacitors, or other suitable capacitor type available in a manufacturing process used to fabricate memory circuit 100.

As mentioned above, different voltage levels on retention supply node 207 may be achieved using different number of capacitors. For example, to generate a voltage level on retention supply node 207 that is substantially half of a voltage level of input power supply node 204, switches 305 and 304 may be closed to couple capacitor 301 between retention supply node 207 and ground supply node 314, and switches 307 and 310 may be closed to couple capacitor 302 between input power supply node 204 and retention supply node 207.

After a period of time, as determined by control circuit 312, switches 304, 305, 307, and 310 may be opened, and switch 311 closed, effectively creating a capacitor voltage divider. Capacitors 301 and 302 then share their respective stored charge, generating a voltage level on nodes 317 and 318 that is substantially half of the voltage level of input power supply node 204.

When the charge sharing is complete, the resultant voltage level is transferred to retention supply node 207, by opening switch 311, and closing switches 303 and 306, thereby coupling capacitor 301 between input power supply node 204 and retention supply node 207. Additionally, switches 308 and 309 are closed, coupling capacitor 302 between ground supply node 314 and retention supply node 207. The entire process may then repeat until the memory circuit exits retention mode.

Control circuit 312 is configured to generate switch control signals 313 using clock signal 206 and retention mode signal 205. In various embodiments, control circuit 312 may include a state machine or other sequential logic circuit configured to generate switch control signals 313 using clock signal 206 and retention mode signal 205. It is noted that in some cases, the contents of register 320 may be used to change the operation of the state machine or sequential logic circuit within control circuit 312. In various embodiments, register 320 may be programmed during an initialization of a computer system, or may be changed during operation based, at least in part, on various performance metrics of the computer system. In some cases, when retention mode signal 205 is inactive, control circuit 312 may be disabled and switch control signals 313 may be held in a state to disable switched converter circuit 202.

It is noted that each of switches 303-311 may be implemented using a variety of circuits. For example, in some cases, a given one of switches 303-311 may include at least two metal-oxide semiconductor field-effect transistors (MOSFETs) arranged as a pass gate or other suitable structure. Alternatively, a single MOSFET may be used for switches 303-311.

Figure 4:
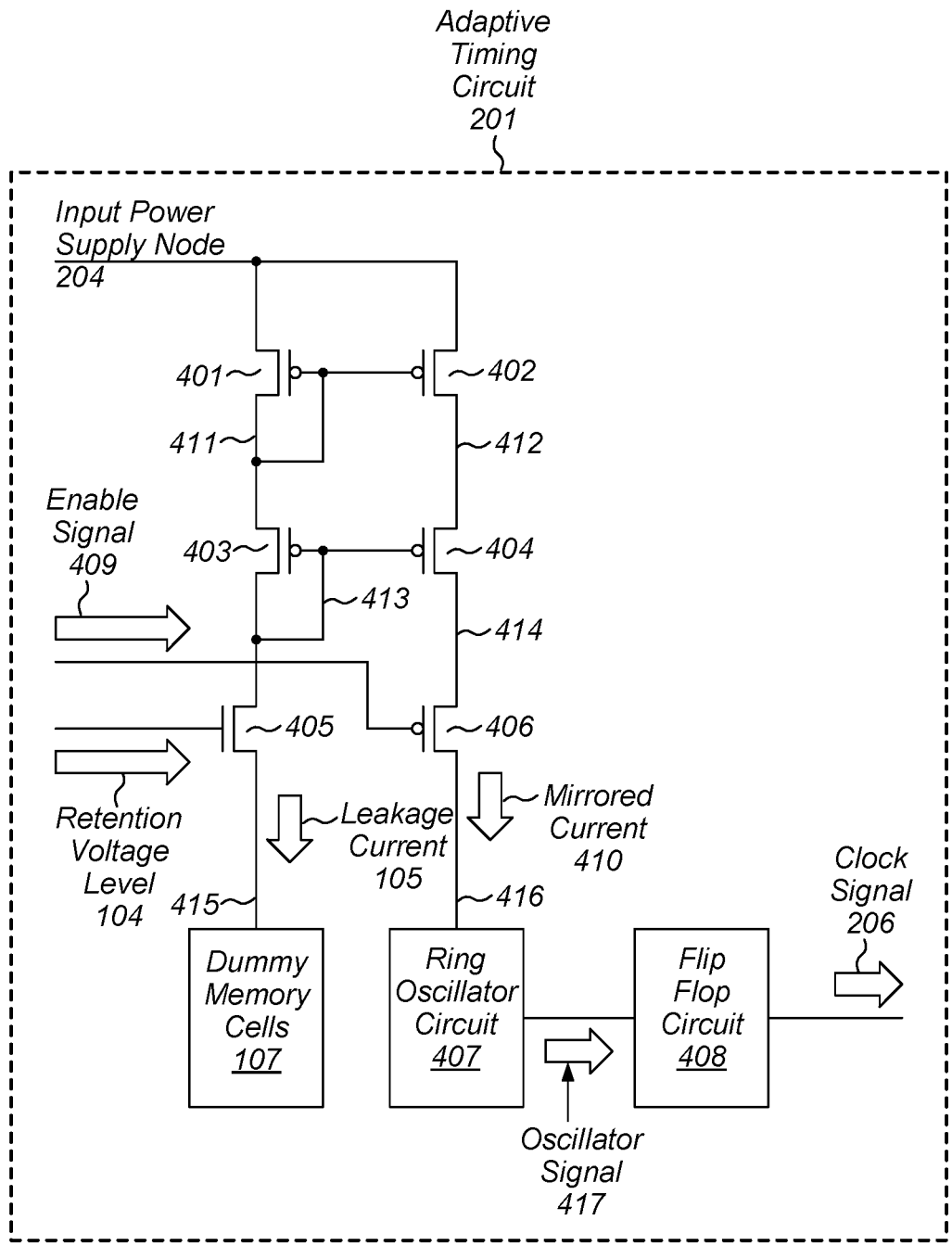
FIG. 4 illustrates a block diagram of an embodiment of an adaptive timing circuit.

Turing to FIG. 4, a block diagram of adaptive timing circuit 201 is depicted. As illustrated, adaptive timing circuit 201 includes devices 401-406, dummy memory cells 107, ring oscillator circuit 407, and flip-flop circuit 408.

Devices 401 and 402 are coupled between input power supply node 204 and nodes 411 and 412, respectively. Control terminals of devices 401 and 402 are coupled to node 411. In a similar fashion, device 403 is coupled between node 411 and node 413, and device 404 is coupled between node 412 and node 414. Control terminals of devices 403 and 404 are coupled to node 413.

Device 405 is coupled between node 413 and node 415, while device 406 is coupled between node 414 and node 416. Device 405 is controlled by retention voltage level 104, and device 406 is controlled by enable signal 409.

It is noted that devices 401-404, and 406 may be particular embodiments of p-channel MOSFETs, while device 405 may be a particular embodiment of an n-channel MOSFET. In other embodiments, any suitable combination of p-channel and n-channel devices may be used for devices 401-406.

Dummy memory cells 107 are coupled to device 405 via node 415. In various embodiments, power supply nodes of dummy memory cells 107 are coupled to node 415. Although dummy memory cells 107 are depicted as being included in adaptive timing circuit 201, in various embodiments, dummy memory cells 107 may be located within memory array 102 and the node 415 is routed between adaptive timing circuit 201 and memory array 102.

With device 405 biased at retention voltage level 104, dummy memory cells 107 will sink leakage current 105 through device 405. Devices 401-404 function as a cascade current mirror, generating mirrored current 410, which flows through device 406 when enable signal 409 is at or near ground potential to enable device 406. In various embodiments, devices 401-404 may be sized in order to scale the value of leakage current 105 up or down to generate mirrored current 410.

Ring oscillator circuit 407 is configured to generate oscillator signal 417 using mirrored current 410. As described below in more detail, ring oscillator circuit 407 may be configured to generate oscillator signal 417 such that a frequency of oscillator signal 417 is based, at least in part, on mirrored current 410.

Flip-flop circuit 408 is configured to generate clock signal 206 using oscillator signal 417. In various embodiments, flip-flop circuit 408 may be a particular embodiment of a toggle flip-flop (referred to as a "T flip-flop") configured to change its output state in response to each edge of ring oscillator circuit 407. Flip-flop circuit 408 may generate clock signal 206 such that a frequency of clock signal 206 is half of a frequency of oscillator signal 417. The use of flip-flop circuit 408 may, in some embodiments, generate clock signal 206 with a duty cycle that is substantially 50 percent.

Figure 5:
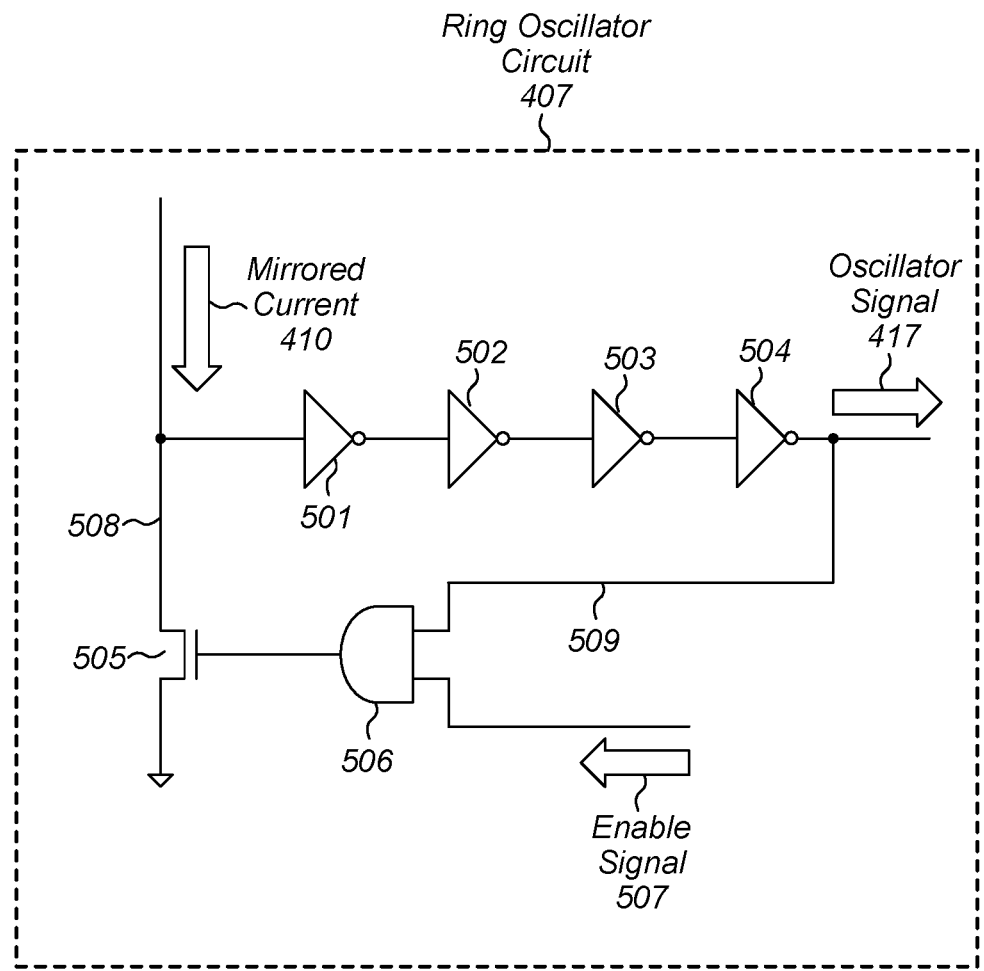
FIG. 5 illustrates a block diagram of an embodiment of a ring oscillator circuit.

An embodiment of ring oscillator circuit 407 is depicted in FIG. 5. As illustrated, ring oscillator circuit 407 includes inverters 501-504, AND gate 506, and device 505.

An input of inverter 501 is coupled to control node 508. An output of inverter 501 is coupled to an input of inverter 502, whose output is coupled to an input of inverter 503. The output of inverter 503 is coupled to an input of inverter 504, whose output is coupled to output node 509. It is noted that although four inverters are depicted in the embodiment of FIG. 5, in other embodiments, any suitable number of inverters may be employed.

The inputs of AND gate 506 are coupled to output node 509 and enable signal 507. The output of AND gate 506 is coupled to a control terminal of device 505. In various embodiments, device 505 is a particular embodiment of an n-channel MOSFET, and is coupled between control node 508 and a ground supply node.

It is noted that inverters 501-504 may be particular embodiments of inverting CMOS amplifiers. In other embodiments, other inverting amplifier circuits, including those using technology other than CMOS, may be employed. Moreover, AND gate 506 may be a particular embodiment of one or more logic circuits configured to implement the Boolean AND function.

When oscillator signal 417 and enable signal 507 are both at a high logic level, device 505 is enabled allowing it to sink current from control node 508. While current is being sunk from control node 508 by device 505, mirrored current 410 is being sourced to control node 508. In various embodiments, mirrored current 410 may be generated using multiple devices, e.g., devices 401-406, as depicted in FIG. 4.

A ratio of the values between mirrored current 410 and the current sunk from control node 508 by device 505 may determine a voltage level on control node 508. The voltage level on control node 508 determines a voltage level on the output node of inverter 501, which, in turn determines a voltage level on the output node of inverter 502, and so on. The voltage level of oscillator signal 417 is then fed back via AND gate 506 and device 505, to control node 508, which changes the voltage level of control node 508, triggering a further change in the voltage level of oscillator signal 417. The aforementioned feedback mechanism allows the generation of a periodic signal, i.e., oscillator signal 417, whose frequency is based, at least in part, on a value of mirrored current 410.

Figure 6:
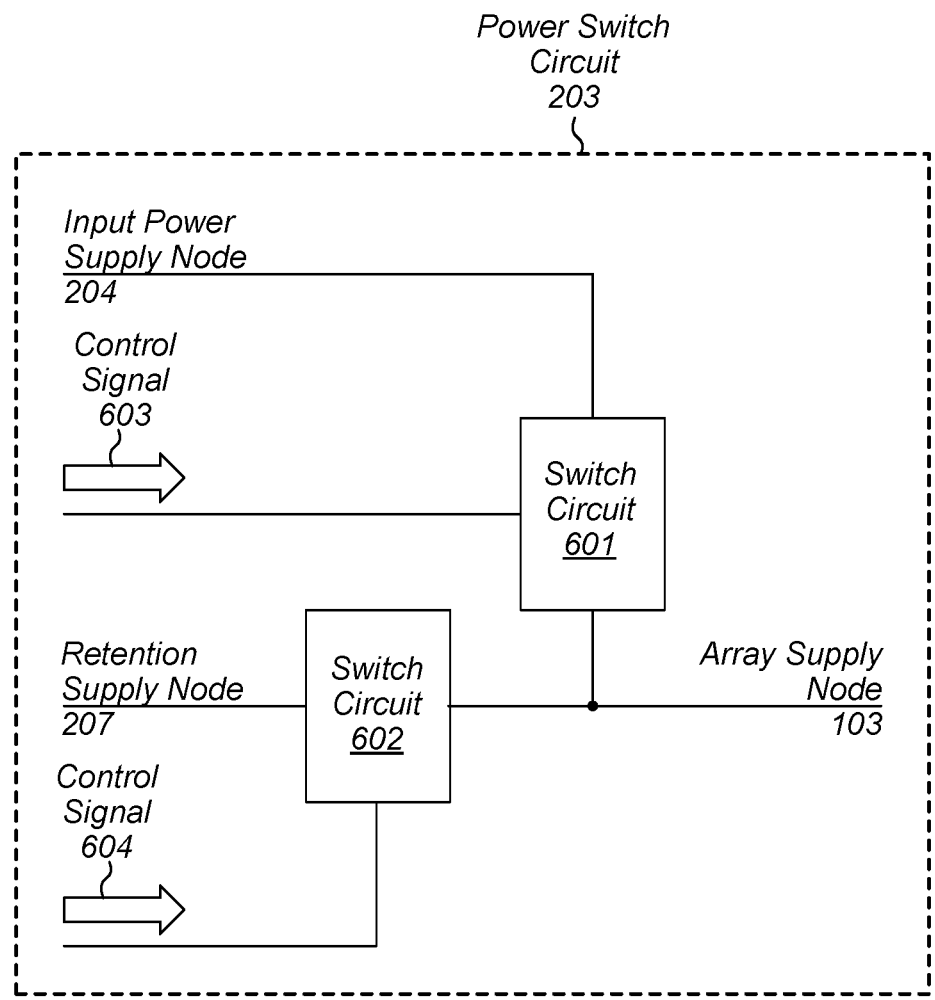
FIG. 6 illustrates a block diagram of an embodiment of a power switch circuit.

Turning to FIG. 6, an embodiment of power switch circuit 203 is depicted. As illustrated, power switch circuit 203 includes switch circuit 601 and switch circuit 602. Switch circuit 601 is coupled between input power supply node 204 and array supply node 103, and is controlled by control signal(s) 603. Switch circuit 602 is coupled between retention supply node 207 and array supply node 103, and is controlled by control signal(s) 604. In various embodiments, control signals 603 and 604 may be based, at least in part, on retention mode signal 205. It is noted that in some embodiments, control signals 603 and 604 may be logical inverses of each other.

Switch circuit 601 is configured to selectively couple input power supply node 204 to array supply node 103 using control signal 603. For example, in response to a given logic level on control signal 603, switch circuit 601 may be configured to couple input power supply node 204 to array supply node 103, while in response to a different logic level on control signal 603, switch circuit 601 may be configured to generate a high impedance between input power supply node 204 and array supply node 103, effectively creating an "open circuit" between the two circuit nodes.

In a similar fashion, switch circuit 602 may be configured to selectively coupled retention supply node 207 to array supply node 103 using control signal 604. For example, switch circuit 602 may be configured to couple retention supply node 207 to array supply node 103 in response to a given logic level on control signal 604. Additionally, switch circuit 602 may be configured to generate a high impedance between retention supply node 207 and array supply node 103, in response to a different logic value on control signal 604.

Switch circuits 601 and 602 may be implemented according to one of various design styles. For example, switch circuits 601 and 602 may each include one or more MOSFETs, or any other suitable switching device.

Figure 7:
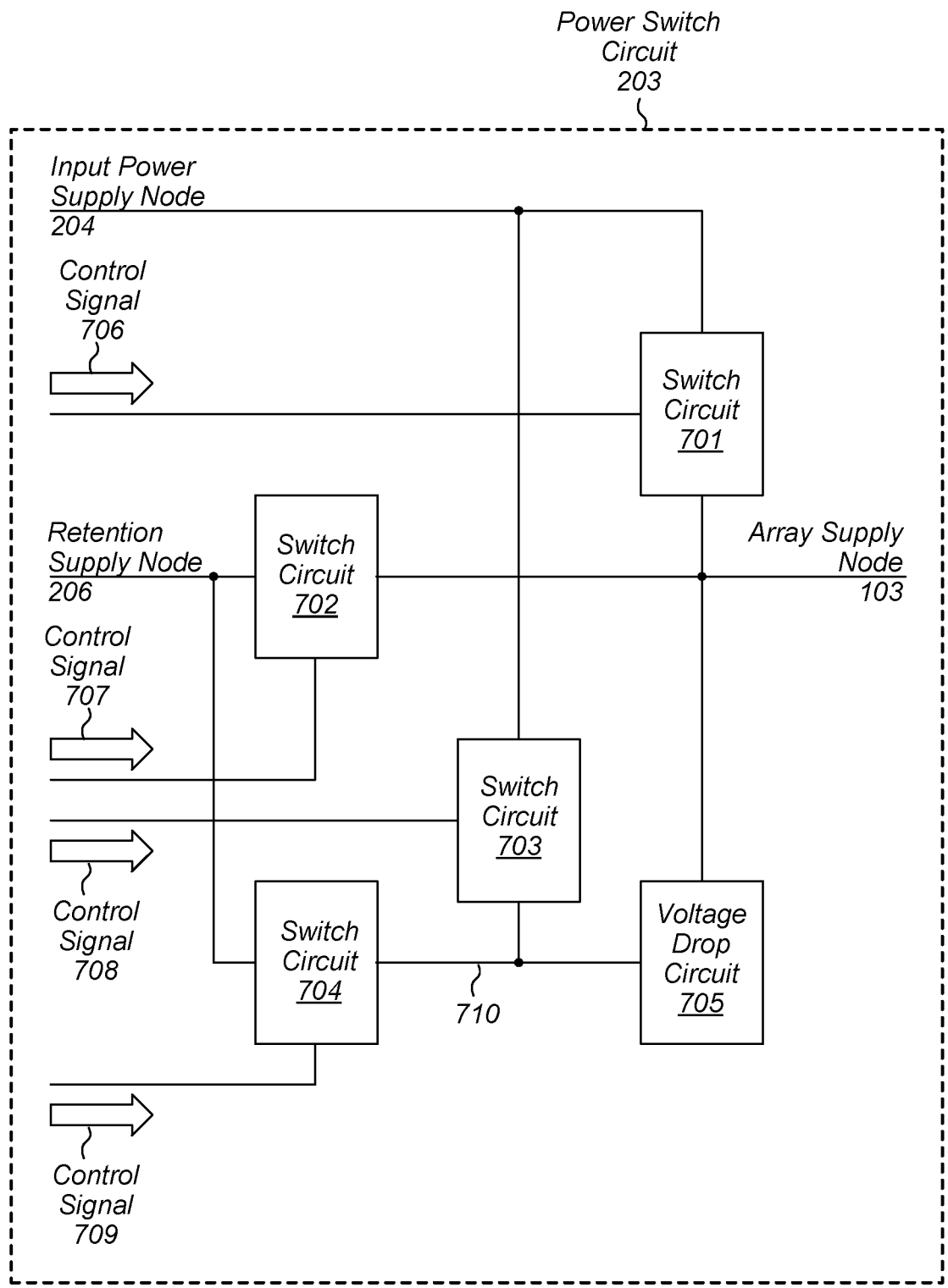
FIG. 7 illustrated a block diagram of an embodiment of another embodiment of a power switch circuit.

In some cases, additional voltage levels on array supply node 103 may be employed for other operating modes of memory circuit 100. In such cases, power switch circuit 203 may include additional circuits to allow for the additional voltage levels on array supply node 103. An embodiment of power switch circuit 203 that allows for more than two voltage levels on array supply node 103 is depicted in FIG. 7. As illustrated, power switch circuit 203 includes switch circuits 701-704, and voltage drop circuit 705.

Switch circuit 701 is configured to selectively couple input power supply node 204 to array supply node 103 using control signal 706. For example, in response to a given logic level on control signal 706, switch circuit 701 may be configured to couple input power supply node 204 to array supply node 103, while in response to a different logic level on control signal 603, switch circuit 601 may be configured to generate a high impedance between input power supply node 204 and array supply node 103, effectively creating an "open circuit" between the two circuit nodes.

Switch circuit 702 may be configured to selectively coupled retention supply node 207 to array supply node 103 using control signal 707. For example, switch circuit 702 may be configured to couple retention supply node 207 to array supply node 103 in response to a given logic level on control signal 707. Additionally, switch circuit 702 may be configured to generate a high impedance between retention supply node 207 and array supply node 103, in response to a different logic value on control signal 604.

In a similar fashion, switch circuit 703 may be configured to selectively couple input power supply node 204 to node 710 using control signal 708. Switch circuit 704 may be configured to selectively couple retention supply node 207 to node 710 using control signal 709. It is noted that only one of switch circuit 703 and 704 may be in a closed position at a time. By employing switch circuits 703 and 704, node 710 may be coupled either to input power supply node 204 or retention supply node 207, thereby allowing voltage drop circuit 705 to use either of the voltage level of input power supply node 204 or the voltage level of retention supply node 207 to generate a voltage level on array supply node 103.

Voltage drop circuit 705 may be configured to generate an output voltage level by reducing a value of an input voltage level. Such a process is commonly referred to as generating a "voltage drop." In the present embodiment, voltage drop circuit 705 is configured to generate a voltage level on array supply node 103 by reducing (or "dropping") a voltage level on node 710. It is noted that when both switch circuit 703 and switch circuit 704 are in an "open" position, a voltage level on node 710 may be insufficient to create a voltage drop to generate a voltage level on array supply node 103. In various embodiments, voltage drop circuit 705 may include any suitable combination of passive circuit elements, e.g., diodes, resistors, and the like.

Each of switch circuits 701-704 may be implemented according to one of various design styles. For example, switch circuits 701-704 may each include one or more MOSFETs, or any other suitable switching device.

Structures, such as those shown in FIGS. 2-7, for generating a retention voltage level may be referred to using functional language. In some embodiments, these structures may be described as including "a means for storing data," "a means for generating a retention voltage level on the array power supply node," and "a means for adjusting the retention voltage level on the array power supply node using a leakage current of the plurality of dummy memory cells."

The corresponding structure for "means for storing data" include memory cells 106, and their equivalents. Switched converter circuit 202, power switch circuit 203, and their equivalents are the corresponding "means for generating a retention voltage level on the array power supply node." The corresponding structure for "means for adjusting the retention voltage level on the array power supply node using a leakage current of the plurality of dummy memory cells" is dummy memory cells 107, adaptive timing circuit 201, switched converter circuit 202, power switch circuit 203, and their equivalents.

Figure 8:
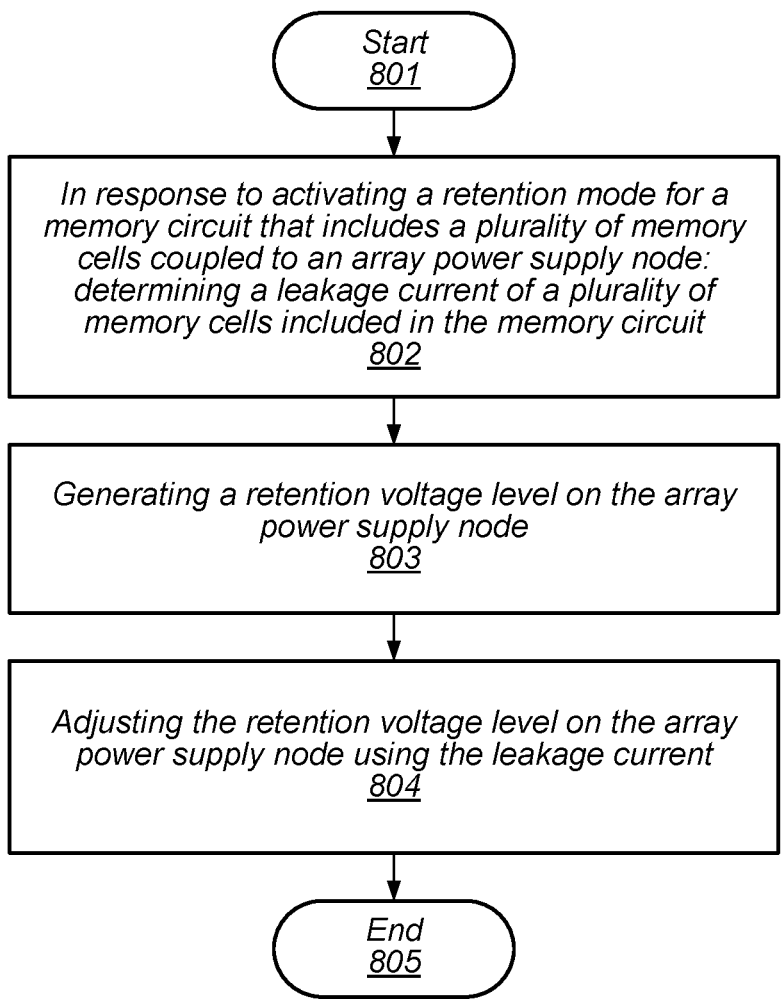
FIG. 8 illustrates a flow diagram depicting an embodiment of a method for generating a retention voltage level for a memory circuit.

Turning to FIG. 8, a flow diagram illustrating an embodiment of a method for generating a retention voltage level for a memory circuit in a computer system is depicted. The method, which may be applied to various memory circuits, e.g., memory circuit 100, begins in block 801.

The method includes, in response to activating a retention mode for a memory circuit that includes a plurality of memory cells coupled to an array power supply node: determining a leakage current of one or more dummy memory cells included in the memory circuit (block 802). In various embodiments, the method may include generating a clock signal using the leakage current of the one or more dummy memory cells. In various embodiments, a frequency of the clock signal may be based, at least in part, on a value of the leakage current.

The method further includes generating a retention voltage level on the array power supply node (block 803). In some embodiments, generating the retention voltage level on the array power supply node may include generating an oscillator signal using a ring oscillator circuit, and adjusting a frequency of oscillator signal using the leakage current. The method may further include generating the clock signal using the oscillator signal.

In various embodiments, generating the retention voltage level may include charging one or more capacitors of a plurality of capacitors to a voltage level of an input power supply node using a plurality of switch control signals. The method may further include discharging the one or more capacitors into a retention supply node using the plurality of switch control signals. The method may also include generating the plurality of switch control signals using the clock signal and a retention mode signal.

The method also includes adjusting the retention voltage level on the array power supply node using the leakage current (block 804). In some embodiments, the method may further include decoupling the array supply node from an input power supply node, and coupling the array supply node to an output of a switched converter circuit configured to generate the retention voltage level. The method concludes in block 805.

Figure 9:
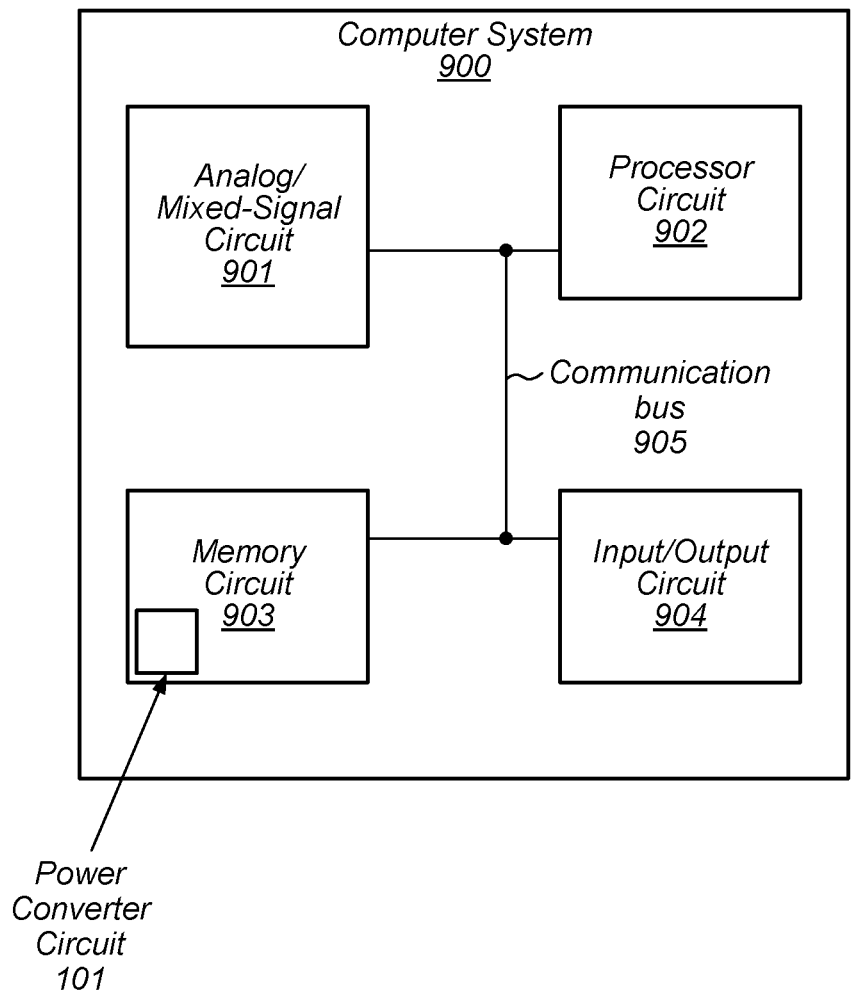
FIG. 9 is a block diagram of one embodiment of a computer system that includes an output buffer circuit.

A block diagram of computer system is illustrated in FIG. 9. As illustrated embodiment, the computer system 900 includes analog/mixed-signal circuits 901, processor circuit 902, memory circuit 903, and input/output circuits 904, each of which is coupled to communication bus 905. In various embodiments, computer system 900 may be a system-on-a-chip (SoC) and be configured for use in a desktop computer, server, or in a mobile computing application such as, a tablet, laptop computer, or wearable computing device.

Analog/mixed-signal circuits 901 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1401 may be configured to perform power management tasks with the inclusion of on-chip power supplies and voltage regulators.

Processor circuit 902 may, in various embodiments, be representative of a general-purpose processor that performs computational operations. For example, processor circuit 902 may be a central processing unit (CPU) such as a microprocessor, a microcontroller, an application-specific integrated circuit (ASIC), or a field-programmable gate array (FPGA).

Memory circuit 903 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. As illustrated, memory circuit 903 includes power converter circuit 101 as depicted in FIG. 1. It is noted that in the embodiment of a computer system in FIG. 9, a single memory circuit is depicted. In other embodiments, any suitable number of memory circuits may be employed.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a memory array including a plurality of memory cells coupled to an array power supply node, wherein the plurality of memory cells includes a plurality of dummy memory cells, and wherein the plurality of memory cells are configured to store data; and
 a power converter circuit configured, in response to activation of a retention mode, to:
  reduce a voltage level of the array power supply node from a voltage level of an input power supply node to a retention voltage level; and
  adjust the retention voltage level on the array power supply node using a leakage current of the plurality of dummy memory cells.

2. The apparatus of claim 1, wherein the power converter circuit is further configured to generate a clock signal using the leakage current.

3. The apparatus of claim 2, wherein to generate the clock signal using the leakage current, the power converter circuit is further configured to:
 mirror the leakage current to generate a mirrored current; and
 generate an oscillator signal using the mirrored current.

4. The apparatus of claim 3, wherein the power converter circuit includes a flip-flop circuit configured to generate the clock signal using the oscillator signal.

5. The apparatus of claim 4, wherein to generate the retention voltage level on the array power supply node, the power converter circuit is further configured to selectively charge one or more of a plurality of capacitors using the input power supply node and a plurality of switch control signals.

6. The apparatus of claim 5, wherein the power converter circuit is further configured to generate the plurality of switch control signals using the clock signal and a retention mode signal.

7. A method, comprising:
 in response to activating a retention mode for a memory circuit that includes a plurality of memory cells coupled to an array power supply node:
  determining a leakage current of one or more dummy memory cells included in the memory circuit;
  reducing a voltage level of the array power supply node from a voltage level of an input power supply node to a retention voltage level; and
  adjusting the retention voltage level on the array power supply node using the leakage current.

8. The method of claim 7, further comprising generating a clock signal using the leakage current of the one or more dummy memory cells.

9. The method of claim 8, wherein a frequency of the clock signal is based, at least in part, on a value of the leakage current.

10. The method of claim 9, wherein generating the retention voltage level on the array power supply node includes:
 generating an oscillator signal using a ring oscillator circuit;
 adjusting a frequency of the oscillator signal using the leakage current; and
 generating the clock signal using the oscillator signal.

11. The method of claim 9, wherein generating the retention voltage level includes:
 charging one or more capacitors of a plurality of capacitors to a voltage level of the input power supply node using a plurality of switch control signals; and
 discharging the one or more capacitors into a retention supply node using the plurality of switch control signals.

12. The method of claim 11, further comprising, generating the plurality of switch control signals using the clock signal and a retention mode signal.

13. The method of claim 7, further comprising:
 decoupling the array power supply node from the input power supply node; and
 coupling the array power supply node to an output of a switched converter circuit configured to generate the retention voltage level.

14. An apparatus, comprising:
 a timing circuit configured to generate a clock signal using a leakage current of a load circuit;
 a switched converter circuit configured to generate a retention voltage level using the clock signal; and
 a power switch circuit configured to couple a local supply node included in the load circuit to an output node of the switched converter circuit using a retention mode signal.

15. The apparatus of claim 14, wherein the timing circuit includes:
 a current mirror circuit configured to generate a mirrored current using the leakage current; and
 a ring oscillator circuit configured to generate an oscillator signal using the mirrored current.

16. The apparatus of claim 15, wherein the ring oscillator circuit includes a plurality of inverter circuits arranged in a daisy chain fashion, and wherein the ring oscillator circuit is configured to adjust a voltage level of an input to a given on of the plurality of inverter circuits using the mirrored current.

17. The apparatus of claim 15, wherein the timing circuit further includes a flip-flop circuit configure to generate the clock signal using the oscillator signal.

18. The apparatus of claim 14, wherein the switched converter circuit includes a plurality of capacitors and a plurality of switches, and wherein to generate the retention voltage level, the switched converter circuit is further configured to:
 couple one or more of the plurality of capacitors to an input power supply node using a plurality of switch control signals; and
 discharge the one or more of the plurality of capacitors into the output node using the plurality of switch control signals.

19. The apparatus of claim 18, wherein the switched converter circuit further includes a control circuit configured to generate the plurality of switch control signals using the clock signal and the retention mode signal.

20. The apparatus of claim 14, wherein the power switch circuit includes:
- a first switch configured, using a first control signal, to selectively couple an input power supply node to a local power supply node included in the load circuit; and
- a second switch configured, using a second control signal, to selectively couple an output node of the switched converter circuit to the local power supply node included in the load circuit.

* * * * *